(12) United States Patent
Sundararajan et al.

(10) Patent No.: US 8,514,927 B2
(45) Date of Patent: Aug. 20, 2013

(54) COMPRESSION CODE FOR TRANSFERRING RATE MATCHED DATA BETWEEN DEVICES

(75) Inventors: Vijay Sundararajan, Richardson, TX (US); Zukang Shen, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1217 days.

(21) Appl. No.: 12/274,247

(22) Filed: Nov. 19, 2008

(65) Prior Publication Data

US 2009/0129461 A1     May 21, 2009

Related U.S. Application Data

(60) Provisional application No. 60/989,359, filed on Nov. 20, 2007.

(51) Int. Cl.
*H04B 1/66* (2006.01)
(52) U.S. Cl.
USPC ........................................... 375/240
(58) Field of Classification Search
USPC ........................................... 375/240
See application file for complete search history.

(56) References Cited

U.S. PATENT DOCUMENTS 4,558,302 A * 12/1985 Welch ............................ 341/51
5,974,181 A * 10/1999 Prieto ........................... 382/232
6,661,845 B1 * 12/2003 Herath ..................... 375/240.23

OTHER PUBLICATIONS

Turner, "Data compression techniques as a means of reducing the storage requirements for satellite data: a quantitative comparison" Radio and Electronic Engineer. Date of Publication: Oct. 1973, vol. 43, Issue: 10, on pp. 599-608.*

* cited by examiner

*Primary Examiner* — Juan A Torres
(74) *Attorney, Agent, or Firm* — Ronald O. Neerings; Wade James Brady, III; Frederick J. Telecky, Jr.

(57) ABSTRACT

A block of N-bit symbols is compressed to reduce transfer bandwidth between two devices. A plurality of locations within the block of N-bit symbols is identified in which a same known N-bit symbol is to be located. The known symbol in each of the plurality of locations is replaced with a substitute 1-bit symbol having a first value. Each remaining symbol in the block of N-bit symbols is marked with a marker bit having a second value. The compressed block of marked N-bit symbols and substitute symbols is transmitted from one device to another device and then decompressed by replacing the substitute symbols with known symbols and removing the markers to restore the original block.

17 Claims, 5 Drawing Sheets

COMPRESSION CODE FOR TRANSFERRING RATE MATCHED DATA BETWEEN DEVICES

CLAIM OF PRIORITY UNDER 35 U.S.C. 119(e)

This application for Patent claims priority to U.S. Provisional Application No. 60/989,359 entitled "Simple Prefix-Free Code for Transferring Rate Matched Data between Devices" filed Nov. 20, 2007, which is incorporated by reference herein.

FIELD OF THE INVENTION

This invention generally relates to wireless communication, and in particular to blocks of data using forward error detection (FEC) with punctured codewords in orthogonal frequency division multiple access (OFDMA), DFT-spread OFDMA, and single carrier frequency division multiple access (SC-FDMA) systems.

BACKGROUND OF THE INVENTION

Wireless cellular communication networks incorporate a number of mobile UEs and a number of NodeBs. A NodeB is generally a fixed station, and may also be called a base transceiver system (BTS), an access point (AP), a base station (BS), or some other equivalent terminology. As improvements of networks are made, the NodeB functionality evolves, so a NodeB is sometimes also referred to as an evolved NodeB (eNB). In general, NodeB hardware, when deployed, is fixed and stationary, while the UE hardware is portable.

In contrast to NodeB, the mobile UE can comprise portable hardware. User equipment (UE), also commonly referred to as a terminal or a mobile station, may be fixed or mobile device and may be a wireless device, a cellular phone, a personal digital assistant (PDA), a wireless modem card, and so on. Uplink communication (UL) refers to a communication from the mobile UE to the NodeB, whereas downlink (DL) refers to communication from the NodeB to the mobile UE. Each NodeB contains radio frequency transmitter(s) and the receiver(s) used to communicate directly with the mobiles, which move freely around it. Similarly, each mobile UE contains radio frequency transmitter(s) and the receiver(s) used to communicate directly with the NodeB. In cellular networks, the mobiles cannot communicate directly with each other but have to communicate with the NodeB.

Control information feedback bits are transmitted, for example, in the uplink (UL), for several purposes. For instance, Downlink Hybrid Automatic Repeat ReQuest (HARQ) requires at least one bit of ACK/NACK transmitted in the uplink, indicating successful or failed circular redundancy check(s) (CRC). Moreover, a one bit scheduling request indicator (SRI) is transmitted in uplink, when UE has new data arrival for transmission in uplink. Furthermore, an indicator of downlink channel quality (CQI) needs to be transmitted in the uplink to support mobile UE scheduling in the downlink. While CQI may be transmitted based on a periodic or triggered mechanism, the ACK/NACK needs to be transmitted in a timely manner to support the HARQ operation. Note that ACK/NACK is sometimes denoted as ACK-NAK or just simply ACK, or any other equivalent term. This uplink control information is typically transmitted using the physical uplink control channel (PUCCH), as defined by the 3GPP working groups (WG), for evolved universal terrestrial radio access (EUTRA). The EUTRA is sometimes also referred to as 3GPP long-term evolution (3GPP LTE). The structure of the PUCCH is designed to provide sufficiently high transmission reliability.

In addition to PUCCH, the EUTRA standard also defines a physical uplink shared channel (PUSCH), intended for transmission of uplink user data. Since PUSCH is designed for transmission of user data, re-transmissions are possible, and PUSCH is expected to be generally scheduled with less stand-alone sub-frame reliability than PUCCH.

Similarly, a physical downlink control channel (PDCCH) and a physical downlink shared channel (PDSCH) are defined for downlink control and data transfers. The modulation schemes supported in the downlink and uplink shared channels are QPSK, 16 QAM and 64 QAM, depending on channel conditions. The general operations of the physical channels are described in the EUTRA specifications, for example: "$3^{rd}$ Generation Partnership Project; Technical Specification Group Radio Access Network; Evolved Universal Terrestrial Radio Access (E-UTRA); Physical Channels and Modulation (TS36.211, Release 8)."

Error-control coding techniques detect and possibly correct errors that occur when messages are transmitted in PUSCH and PDSCH. To accomplish this, the encoder transmits not only the information symbols but also extra redundant parity symbols. The decoder interprets what it receives, using the redundant symbols to detect and possibly correct whatever errors occurred during transmission.

Block coding is a special case of error-control coding. Block-coding techniques map a fixed number of message symbols to a fixed number of code symbols. A block coder treats each block of data independently and is a memory-less device. The information to be encoded consists of message symbols and the code that is produced consists of codewords. Each block of K message symbols is encoded into a codeword that consists of N message symbols. K is called the message length, N is called the codeword length, and the code is called an [N,K] code.

Turbo codes are a class of high-performance error correction codes developed in 1993 which are finding use in deep space satellite communications and other applications where designers seek to achieve maximal information transfer over a limited-bandwidth communication link in the presence of data-corrupting noise. The channel coding scheme for transport blocks in LTE is Turbo Coding with a coding rate of R=⅓, using two 8-state constituent encoders and a contention-free quadratic permutation polynomial (QPP) turbo code internal interleaver. Trellis termination is used for the turbo coding. Before the turbo coding, transport blocks are segmented into byte aligned segments with a maximum information block size of 6144 bits. Error detection is supported by the use of 24 bit CRC. The ⅓ coding rate triples the bit-count for transmission of the block.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

In next generation cellular/communication systems the channel coding rate will be adapted according to channel conditions. For example, a code rate of ⅓ might be used under weak channel conditions, whereas a code rate approximately equal to one might be used when the channel is strong. When channel quality is good and a code rate that is better than ⅓ is used a rate matching scheme is required. In some of the next generation of standards, such as LTE (Long Term Evolution) for UMTS, the following strategy is employed. The data is first encoded using a mother code with rate=⅓. A rate matching scheme is then used to puncture portions of the systematic and parity bits to get the target code rate. At the receiver side this process is reversed. Erasure symbols are inserted on the received data to bring the effective code rate back to ⅓ in a process referred to as reverse rate matching.

In a platform implementing a baseband receiver chain for such systems, the channel decoding and reverse rate matching may be done on different physical devices due to total complexity and transistor or gate count availability on a single device. Under such a scenario, when a code rate ~1 is employed, roughly ⅔ of the data transferred between the two devices would be erasure symbols. Typically, an eight-bit bit precision is employed for data that is transferred between the two devices. The eight-bit precision is a soft value that represents a probability of the symbol being a zero or a one value. Various embodiments may use different precision or different symbol meanings. For example, in an alternate embodiment, each symbol may represent more than one bit.

The received data-rate in the baseband receiver may be upwards of 100-150 Mbps. Therefore, the transfer bandwidth between the two devices would be approximately 100-150 Mbps×8 bit precision×3 (including erasure symbols)=2.4-3.6 gbps. In order to reduce the amount of data being transferred between the two devices, a compression scheme may be used, as described herein.

Figure 1:
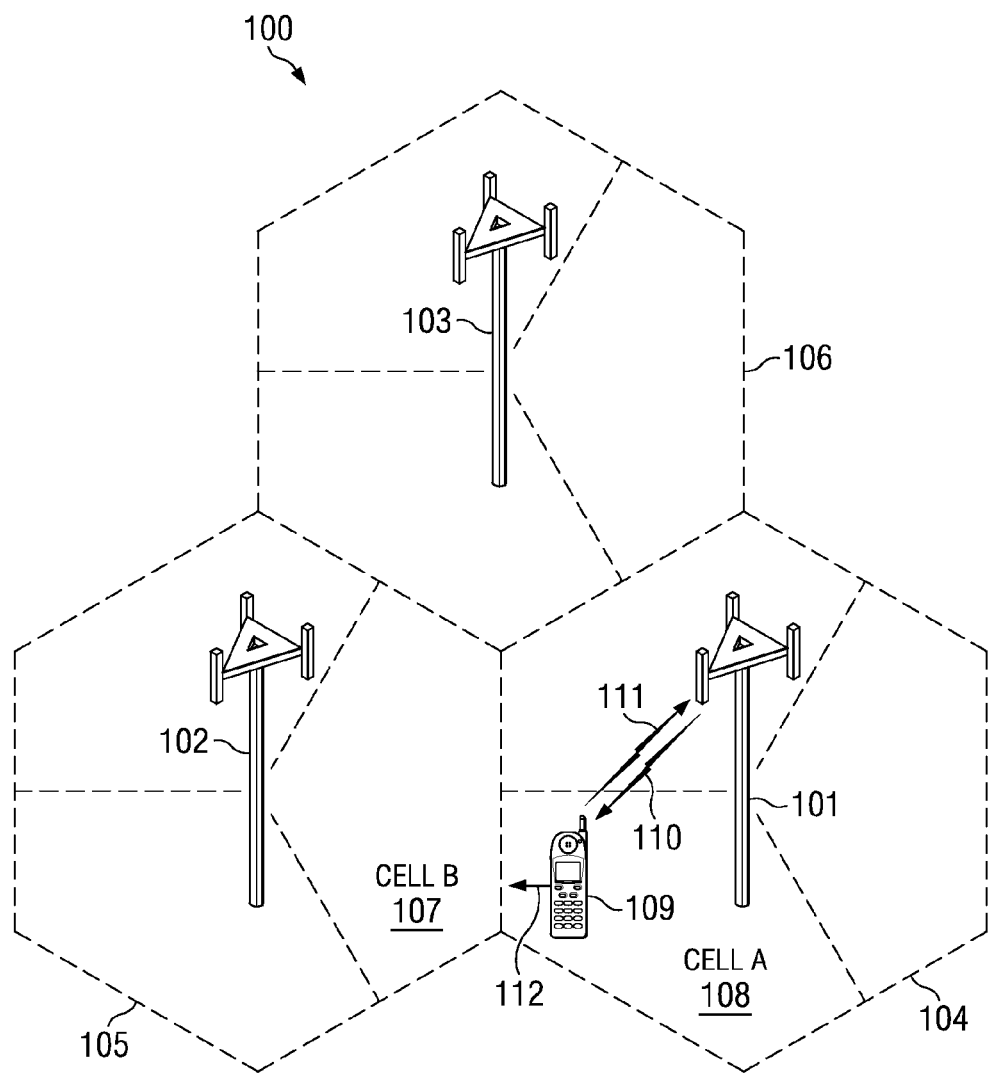
FIG. 1 is a pictorial of an illustrative telecommunications network that employs an embodiment of restricted feedback in the physical uplink control channel (PUCCH)

FIG. 1 shows an exemplary wireless telecommunications network 100. The illustrative telecommunications network includes representative base stations 101, 102, and 103; however, a telecommunications network necessarily includes many more base stations. Each of base stations 101, 102, and 103 are operable over corresponding coverage areas 104, 105, and 106. Each base station's coverage area is further divided into cells. In the illustrated network, each base station's coverage area is divided into three cells. Handset or other UE 109 is shown in Cell A 108, which is within coverage area 104 of base station 101. Base station 101 is transmitting to and receiving transmissions from UE 109 via downlink 110 and uplink 111. As UE 109 moves out of Cell A 108, and into Cell B 107, UE 109 may be handed over to base station 102. Because UE 109 is synchronized with base station 101, UE 109 must employ non-synchronized random access to initiate handover to base station 102. A UE in a cell may be stationary such as within a home or office, or may be moving while a user is walking or riding in a vehicle. UE 109 moves within cell 108 with a velocity 112 relative to base station 102.

Embodiments of base station 101 process large amount of data traffic received on UL 111 from multiple mobile devices within each cell. In addition, the base station performs higher layer control flow processing. Physical devices, such as integrated circuits (IC), are provided to perform portions of this processing. Data that must be transferred between devices may be compressed as described in more detail below.

Each UE 109 may also be embodied using more than one IC device. Processing of data traffic received on DL 110 may require transfer of the intermediate rate matched data between devices, which may similarly be compressed as described in more detail below.

Figure 2:
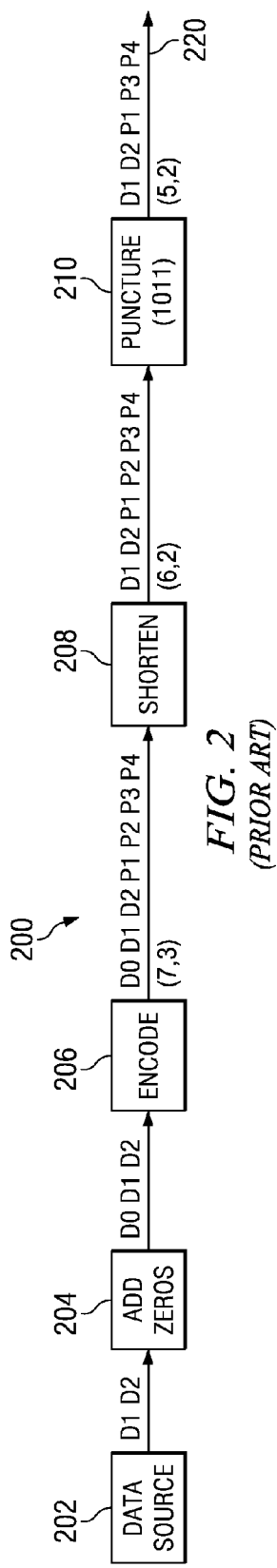
FIG. 2 is a block diagram of an example transmitter for use in the network of FIG. 1.

FIG. 2 is a block diagram of an example prior art transmitter 200 for use in the network of FIG. 1. An embodiment of this transmitter may be included in UE for transmitting data on uplink to the NodeB. An embodiment of this transmitter may also be included in a NodeB for transmitting data on downlink to each UE. In either case, data that is to be transmitted is provided to data source 202. This may be voice or music data, graphics data, internet information data, or other sources of data that are to be used or consumed by the UE or provided by the UE to the NodeB for forwarding to other UE or to other network applications.

Many standards utilize punctured codes, and digital receivers can easily output erasures. BCH (Bose, Ray-Chaudhuri, Hocquenghem) and RS (Reed-Soloman) codes performance improves significantly in fading channels where the receiver generates erasures. A punctured codeword has only parity symbols removed, and a shortened codeword has only information symbols removed. A codeword with erasures can have those erasures in either information symbols or parity symbols.

For simplicity, the example transmitter of FIG. 2 generates a (7,3) codeword, meaning seven total bits, with three data bits. Both shortening and puncturing are illustrated; however, a specific embodiment may be designed to use only one or the other. Other embodiments may use longer codewords. As mentioned earlier, block sizes of up to 6144 bits are common.

In this example, data source 202 outputs two information symbols, designated by D1, D2. (For a BCH example, the symbols are simply binary bits.) Because the code is a shortened (7,3) code, a zero must be added ahead of the information symbols in "add zeros" function 204, yielding a three-symbol message of D0, D1, D2 The modified message sequence is then encoded by encode function 206 to form a (7, 3) codeword, and the added information zero is subsequently removed in shortening function 208 to form a (6,2) codeword, which yields a result of D1 D2 P1 P2 P3 P4. In this example, the parity bits are at the end of the codeword, but in another embodiment the order may be reversed or otherwise changed.

The puncturing operation in puncture function 210 is governed by a puncture vector, which, in this case, is 1011. Within the puncture vector, a 1 means that the symbol is kept, and a 0 means that the symbol is thrown away. In this example, the puncturing operation removes the second parity symbol, yielding a final (5, 2) codeword of D1 D2 P1 P3 P4 on interconnect 220 for transmission to a receiver. The puncture vector is known by both the transmitter and the receiver and varies depending on channel quality.

Figure 3:
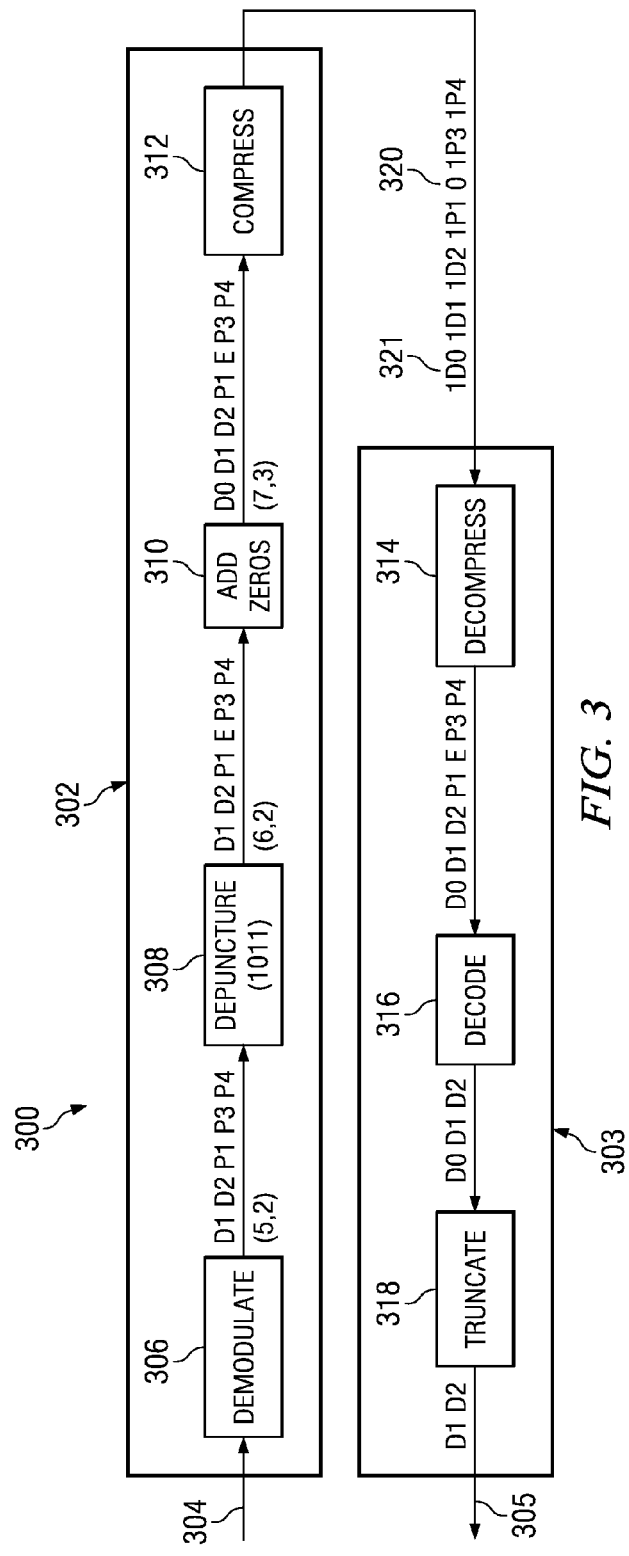
FIG. 3 is a block diagram of an illustrative receiver for use in the network of FIG. 1, in which the receiver is partitioned into two separate physical devices and a compressed data stream is transferred between devices.

FIG. 3 is a block diagram of an illustrative receiver 300 for use in the network of FIG. 1, in which the symbol processing portion of the receiver is partitioned into two separate physical devices 302, 303 and a compressed data stream is transferred between the two devices. Device 302 performs demodulation and reverse rate matching on final (5, 2) codeword of D1 D2 P1 P3 P4, from transmitter 200, received on interconnect 304, while device 303 performs decoding. This example illustrates how a decoder operates on the shortened and punctured codeword generated by the transmitter in FIG. 2.

It should be noted that the codeword may be punctured further by removing more of the parity bits. When the codeword is punctured to sufficiently to change the rate to approximately one, then few parity bits remain.

As shown in the preceding figure, the signal transmitted from one network node to another in this example is a (5, 2) codeword, because it has been shortened from a (7, 3) codeword by one symbol, and one symbol has also been punctured. After demodulate function 306 demodulates the received signal, the (5, 2) codeword is retrieved and sent to depuncture function 308. As a first step, the decoder adds an erasure, designated by E, in the second parity position of the codeword to form a (6, 2) codeword. This corresponds to the puncture vector 1011, which is agreed upon and known by both the transmitter and the receiver. Adding a zero (D0) in "add zeros" function 310 accounts for shortening, in the same way as shown in the preceding figure. The single erasure does not exceed the erasure-correcting capability of the code, which can correct four erasures. At this point, the received signal has been demodulated and reverse rate matched back to the original (7, 3) codeword.

Since the decoding function is performed in a separate device 303, the rate matched codeword must now be transferred to the other device. Compress function 312 performs a compression operation. The data is classified into two categories: 1) Useful data; and 2) Erasure symbols.

A simple prefix free scheme is used in which a single bit having a value of '0' is substituted for erasure symbols as illustrated at 320 and normal data is prepended, or "marked," with a single bit having the opposite value of '1' as illustrated generally at 321. The prefix free coded data is transferred between devices. Of course, in another embodiment, the values for the substitute symbol and the marking bit could be reversed, or a symbol having more than one bit could be used as the substitute symbol and/or marker.

The effective transfer rate for code rate approaching ~1 where almost all of the parity bits have been punctured would now come down to: [100-150 mbps×9 (8 bit precision+1 marker bit)×1]+[100-150 mbps×1 substitute symbol×2 (erasure symbols coded with 1 bit)]=1.1 gbps-1.65 gbps, thereby bringing savings of more than 50% on the interface bandwidth requirements.

After transferring the compressed codeword to device 303, decompress function 314 restores the codeword by replacing each substitute symbol 320 with an erasure symbol and removing each mark prepend bit 321.

The decoding operation is performed in decode function 316 using known techniques results in the three-symbol message D0 D1 D2, where D0 refers to a dummy symbol. The first symbol is truncated in truncate function 318, yielding a final output of D1 D2.

Figure 4:
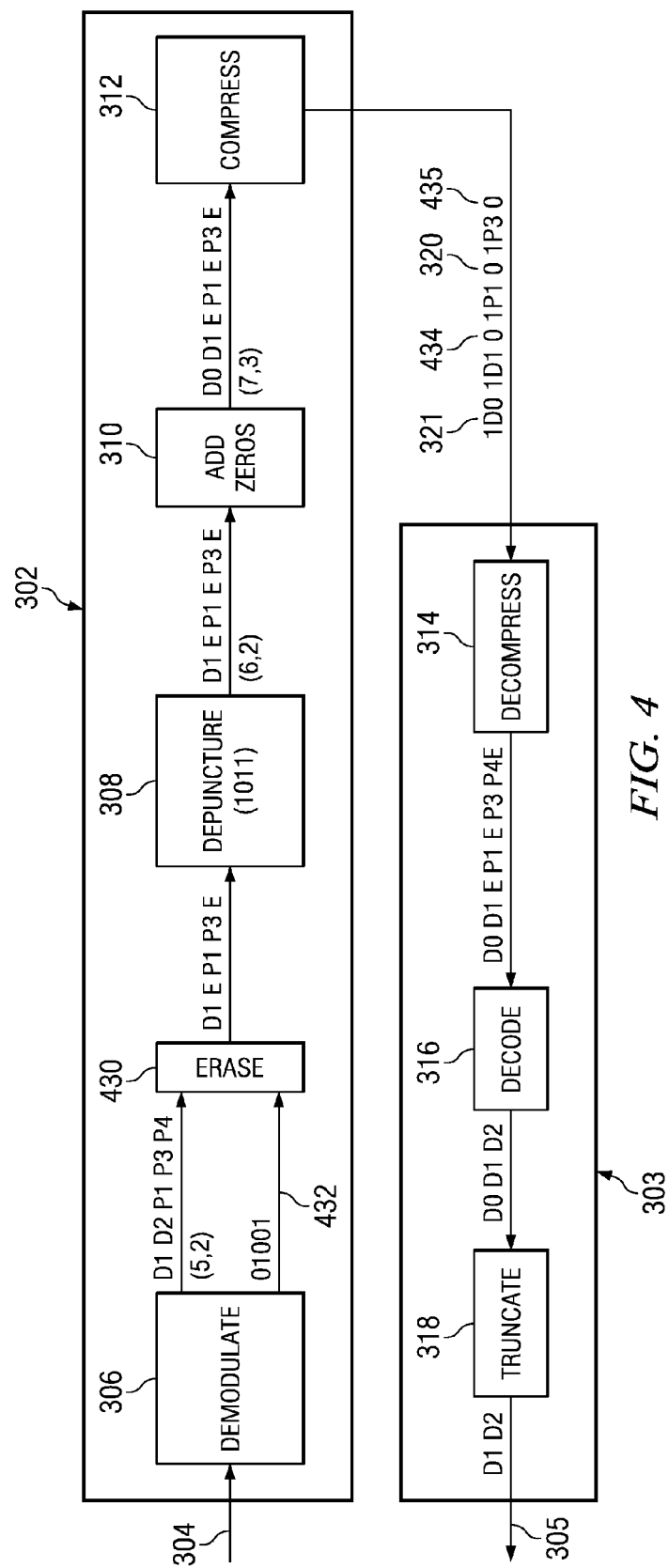
FIG. 4 is another version of the illustrative receiver of FIG. 3 in which erasure symbols are introduced by the demodulator.

FIG. 4 is another version of the illustrative receiver of FIG. 3 in which erasure symbols are introduced by the demodulator function 306. In this example, demodulator 306 receives the (5, 2) codeword that the encoder sent. The demodulator declares that two of the five received symbols are unreliable enough to be erased, such that symbols 2 and 5 are deemed to be erasures, for example. The 01001 vector indicated at 432, is output by demodulator 306 to indicate these erasures. Within the erasures vector, a 1 means that the symbol is to be replaced with an erasure symbol, and a 0 means that the symbol is passed unaltered. Erase function 430 replaces the unreliable symbols with erasures. The resulting codeword is D1 E P1 P3 E, where E is an erasure symbol.

The codeword is then depunctured in depuncture function 308, according to the known puncture vector used in the encoding operation (i.e., 1011). Thus, an erasure symbol is inserted between P1 and P3, yielding a codeword of D1 E P1 E P3 E.

Just prior to decoding, the addition of zeros at the beginning of the information vector in "add zeros" function 310 accounts for the shortening. The resulting vector is D0 D1 E P1 E P3 E such that a (7, 3) codeword is ready for decoding.

As in the example of FIG. 3, compress function 312 compresses the codeword to minimize the amount of data that needs to be transferred from device 302 to device 303. In this example, substitute symbols occur at 434, 435 and 320.

After transferring the compressed codeword to device 303, decompress function 314 restores the codeword by replacing each substitute symbol 320, 434 and 435 with an erasure symbol and removing each mark prepend bit 321.

The decoding operation is performed in decode function 316 using known techniques results in the three-symbol message D0 D1 D2, where D0 refers to a dummy symbol. The first symbol is truncated in truncate function 318, as in the preceding figure, yielding a final output of D1 D2 on interconnect 305.

Figure 5:
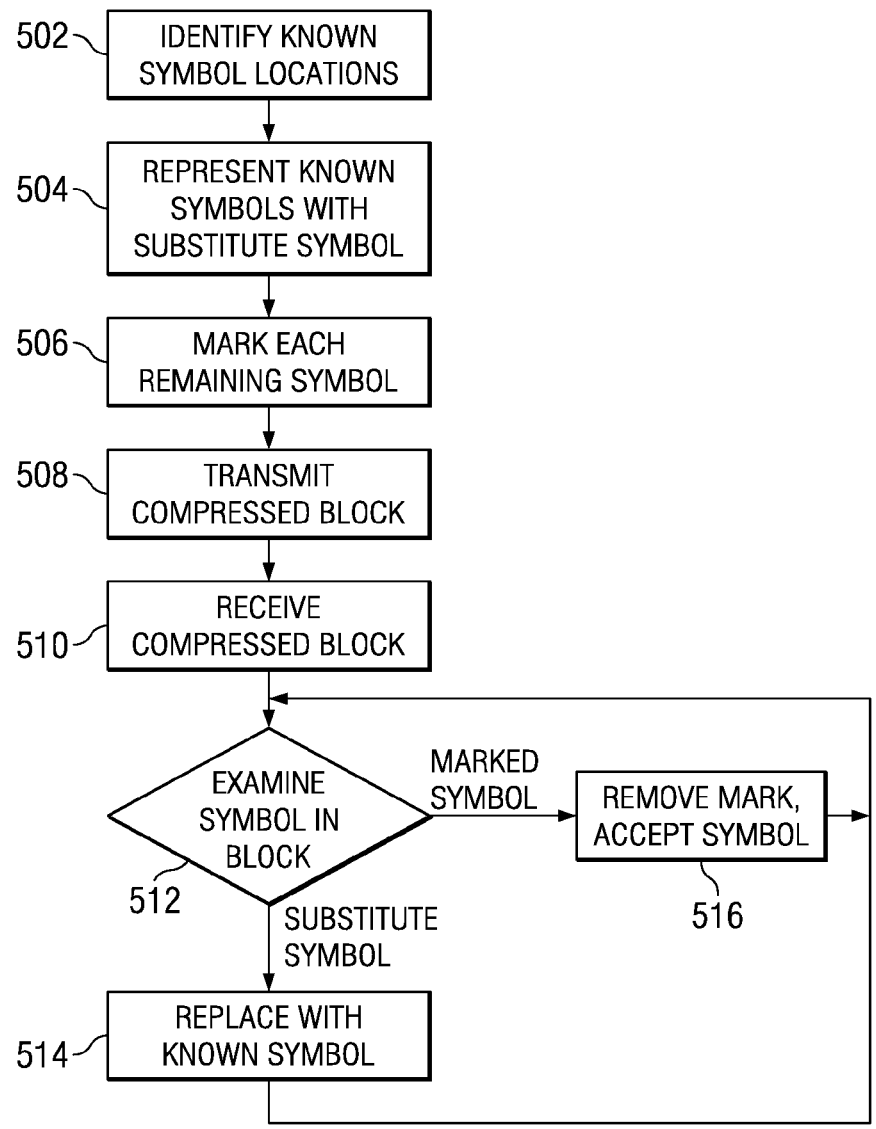
FIG. 5 is a flow diagram illustrating operation of compression and decompression.

FIG. 5 is a flow diagram illustrating operation of compression and decompression. A block of multiple (N)-bit symbols is examined to identify 502 one or more locations in which the symbols are a known value. In the example above, the erasure symbols all have a same N-bit value and therefore can be represented 504 by a shortened substitute symbol. In the above examples, the substitute symbol was a 1-bit symbol have a value of "0". However, in other embodiments the substitute symbol could be given the value of "1", or the substitute symbol could have more than one bit, but less than N bits.

Each remaining symbol that is not a pre-known symbol is marked 506 with a marker value. For example, the marker may be the inverse of the substitute symbol if the substitute symbol is one bit. If the substitute symbol is more than one bit, then the marker must be a known value different from the substitute symbol value.

The compressed block is then transmitted 508 from a first device to a second device. In the second device, the compressed block is received 510 and decompressed by examining 512 each symbol in the compressed block. Each substitute symbol is replaced 514 with the known symbol value. Each marked symbol is restored by removing 516 the mark and accepting the symbol. The examination may proceed bit by bit. A first bit in the block is examined. If it is a "0" it is a substitute symbol which is replaced with the known symbol value. The next bit is then examined; if it is a "1" it is a marker bit. The marker bit is then removed and discarded and the next N bits are accepted as being the next symbol. The next bit is then examined and the process repeats until the end of the block.

SYSTEM EXAMPLES

Figure 6:
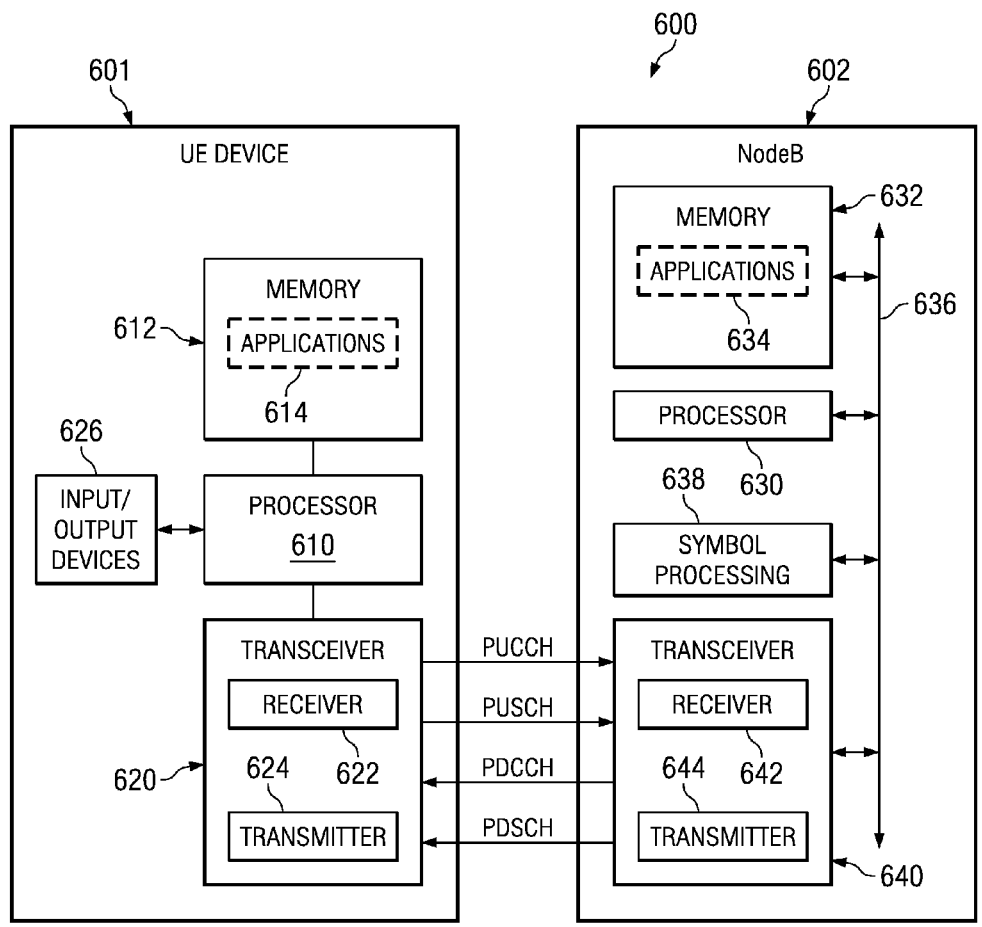
FIG. 6 is a block diagram of a Node B and a User Equipment for use in the network system of FIG. 1.

FIG. 6 is a block diagram illustrating operation of a NodeB and a mobile UE in the network system of FIG. 1. Wireless networking system 600 comprises a mobile UE device 601 in communication with NodeB 602. The mobile UE device 601 may represent any of a variety of devices such as a server, a desktop computer, a laptop computer, a cellular phone, a Personal Digital Assistant (PDA), a smart phone or other electronic devices. In some embodiments, the electronic mobile UE device 601 communicates with the NodeB 602 based on a LTE or E-UTRAN protocol. Alternatively, another communication protocol now known or later developed can be used.

As shown, the mobile UE device 601 comprises a processor 610 coupled to a memory 612 and a Transceiver 620. The memory 612 stores (software) applications 614 for execution by the processor 610. The applications could comprise any known or future application useful for individuals or organizations. As an example, such applications could be categorized as operating systems (OS), device drivers, databases, multimedia tools, presentation tools, Internet browsers, e-mailers, Voice-Over-Internet Protocol (VOIP) tools, file browsers, firewalls, instant messaging, finance tools, games, word processors or other categories. Regardless of the exact nature of the applications, at least some of the applications may direct the mobile UE device 601 to transmit UL signals to the NodeB (base-station) 602 periodically or continuously via the transceiver 620. In at least some embodiments, the mobile UE device 601 identifies a Quality of Service (QoS) requirement when requesting an uplink resource from the NodeB 602. In some cases, the QoS requirement may be implicitly derived by the NodeB 602 from the type of traffic supported by the mobile UE device 601. As an example, VOIP and gaming applications often involve low-latency uplink (UL) transmissions while High Throughput (HTP)/Hypertext Transmission Protocol (HTTP) traffic can involve high-latency uplink transmissions.

Transceiver 620 includes uplink logic which may be implemented by execution of instructions that control the operation of the transceiver. Some of these instructions may be stored in memory 612 and executed when needed. As would be understood by one of skill in the art, the components of the Uplink Logic may involve the physical (PHY) layer and/or the Media Access Control (MAC) layer of the transceiver 620. Transceiver 620 includes one or more receivers 622 and one or more transmitters 624.

Receiver 622 may be embodied as two or more devices in which reverse rate matching is performed in one device, and decoding is performed in a second device. Each reverse rate matched block is compressed and transferred to the decoding device using the compression scheme described in more detail above. It is then decompressed and decoded, as described above.

Processor 610 may send or receive data to various input/output devices 626. A subscriber identity module (SIM) card stores and retrieves information used for making calls via the cellular system. A Bluetooth baseband unit may be provided for wireless connection to a microphone and headset for sending and receiving voice data. Processor 610 may send information to a display unit for interaction with a user of the mobile UE during a call process. The display may also display pictures received from the network, from a local camera, or from other sources such as a USB connector. Processor 610 may also send a video stream to the display that is received from various sources such as the cellular network via RF transceiver 622 or the camera.

As shown in FIG. 6, NodeB 602 comprises a Processor 630 coupled to a memory 632, symbol process circuitry 638, and a transceiver 640 via backplane bus 636. The memory stores applications 634 for execution by processor 630. The applications could comprise any known or future application useful for managing wireless communications. At least some of the applications 634 may direct the base-station to manage transmissions to or from the user device 601.

Transceiver 640 comprises an uplink Resource Manager, which enables the NodeB 602 to selectively allocate uplink PUSCH resources to the user device 601. As would be understood by one of skill in the art, the components of the uplink resource manager may involve the physical (PHY) layer and/or the Media Access Control (MAC) layer of the transceiver 640. Transceiver 640 includes a Receiver(s) 642 for receiving transmissions from various UE within range of the NodeB and transmitter(s) 644 for transmitting data and control information to the various UE within range of the NodeB.

The uplink resource manager executes instructions that control the operation of transceiver 640. Some of these instructions may be located in memory 632 and executed when needed on processor 630. The resource manager controls the transmission resources allocated to each UE that is being served by NodeB 602 and broadcasts control information via the physical downlink control channel PDCCH.

Symbol processing circuitry 638 performs demodulation and reverse rate matching in one device and decoding in a different device. Each reverse rate matched block is compressed and transferred to the decoding device using the compression scheme described in more detail above. It is then decompressed and decoded, as described above.

Figure 7:
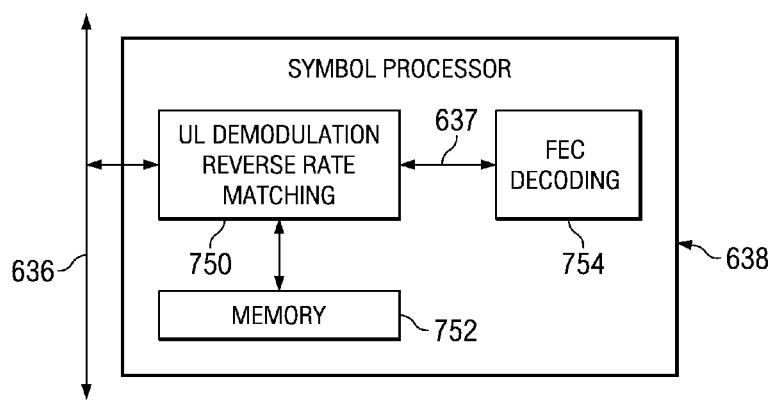
FIG. 7 is a block diagram of an embodiment of a symbol processor for use in the NodeB of FIG. 6.

FIG. 7 is a block diagram of an embodiment of a symbol processor for use in the NodeB of FIG. 6. Block coded transmission signals from a given UE are received by a receiver 642 (FIG. 6) and transferred via backplane bus 636 to symbol processor 638. Uplink demodulation and rate matching device 750 receives each block coded transmission signal from the receiver and performs demodulation and reverse rate matching as described with reference to FIGS. 3 and 4. Compression is then performed as described in more detail above, and the compressed block is transferred to the forward error correction (FEC) decoding device 754. The compressed block is then decompressed and decoded as described above with reference to FIGS. 3 and 4. Local memory 752 may be used to store each block during processing. Recall that in some embodiments an information block may contain up to 6144 bits, where each bit is a symbol. The decoded block of symbols is then transferred to processor 630 via backplane 636 for further processing of the information contained therein using known techniques.

Demodulation and rate matching device 750 may be embodied by a processor core executing instructions stored in memory 752. Compression of each block is then performed by executing another set of instructions stored in memory 752. In another embodiment, hardwired control circuitry or other types of state machines may perform the compression operation.

Similarly, the decompression in decoding device 754 may be embodied by a processor core executing stored instructions, or by hardwired logic or by other forms of state machine, in a field programmable logic array (FPLA), for example.

The compressed block is transferred from device 750 to device 754 via interconnect 637. In this embodiment, interconnect 637 is a serial rapid I/O (sRIO) bus, which is a will known device interconnect standard that can support transfer rates of up to 6.25 gbps on each serial lane. Other embodiment may use other types of serial or parallel interconnect structures for transferring the compressed blocks of data.

Other Embodiments

Various other embodiments of the invention will be apparent to persons skilled in the art upon reference to this description. For example, various types of foreword error correction (FEC) may be embodied to produce different types of parity bits. Block sizes may be varied according to the FEC scheme that is used and may exceed the current maximum block size of 6144 bits.

While a code rate of ⅓ was described herein, another embodiment may use a code rate either higher or lower than ⅓ and still take advantage of the compression technique described herein.

In another embodiment, adding and removing zeros to the message symbols may not be needed if a shortened code is not used.

The eight-bit precision value is a soft value that represents a probability of the symbol being a zero or a one value. Various embodiments may use different precision or different symbol meanings. For example, in an alternate embodiment, each symbol may represent more than one bit.

In another embodiment, the compression technique described herein may be applied to transfer data between devices used in other types of systems that use variable rate data with punctured symbols, such as data networks, space communications, etc.

In another embodiment, the substitute symbols and marker bits may be grouped together as a vector that transferred along with the compressed block, rather than being disbursed within the compressed block, in a similar manner as the erasure vector described earlier.

In another embodiment, the various device blocks may be implemented on a single chip, but a version of the compression scheme described herein may be used to convey data from one portion of the single chip to another in order to conserve signal routing channels or to reduce noise on the chip.

In the examples described herein, an erasure symbol was considered a known symbol, since it has just one value. In another embodiment, a known symbol may have more than one value and a multi-valued substitute symbol can be selected to represent each of the known values.

As used herein, the terms "applied," "coupled," "connected," and "connection" mean electrically connected, including where additional elements may be in the electrical connection path. "Associated" means a controlling relationship, such as a memory resource that is controlled by an associated port. While the invention has been described with reference to illustrative embodiments, this description is not intended to be construed in a limiting sense.

It is therefore contemplated that the appended claims will cover any such modifications of the embodiments as fall within the true scope and spirit of the invention.

What is claimed is:

1. A method for compressing a block of N-bit symbols comprising:
   identifying a plurality of locations within the block of N-bit symbols in which a same N-bit known symbol is located, wherein N is an integer;
   representing the known symbol in each of the plurality of locations with a substitute 1-bit symbol having a first value;
   marking each remaining symbol in the block of N-bit symbols with a marker bit having a second value; and
   transmitting the marked block of marked N-bit symbols and substitute symbols.

2. The method of claim 1, further comprising:
   receiving the block of marked N-bit symbols and substitute symbols; and
   decompressing the block of marked N-bit symbols by replacing each substitute symbol with the known N-bit symbol and removing each marker bit to form a decompressed block of N-bit symbols.

3. The method of claim 1, wherein the known N-bit symbol is an erasure symbol.

4. The method of claim 1, wherein identifying a plurality of locations comprises:
   dividing the block of N-bit symbols into sets of N-bit symbols having a fixed set size; and
   using a location vector to identify where the known symbols are to be located in each of the sets of N-bit symbols.

5. The method of claim 2, wherein decompressing comprises:
   examining a bit in the marked block of N-bit symbols;
   removing the examined bit and either accepting the next N bits from the marked block of N-bit symbols when the examined bit is a marker bit or inserting the known N-bit symbol when the examined bit is a substitute symbol; and
   repeating the steps of examining and removing on the next bit in the marked block until the end of the block is reached.

6. A method for compressing a block of N-bit symbols comprising:
   identifying a plurality of locations within the block of N-bit symbols in which a same N-bit known symbol is located, wherein N is an integer;
   representing the known symbol in each of the plurality of locations with a substitute symbol bit having a first value, wherein the substitute symbol comprises M bits, where M<N;
   marking each remaining symbol in the block of N-bit symbols with a marker having a second value; and
   transmitting the market block of marked N-bit symbols and substitute symbols.

7. The method of claim 6, further comprising:
   receiving the market block of marked N-bit symbols and substitute symbols; and
   decompressing the market block of N-bit symbols by replacing each substitute symbol with the known N-bit symbol and removing each marker to form a decompressed block of N-bit symbols.

8. The method of claim 7, wherein decompressing comprises:
   examining a set of bits in the market block of N-bit symbols;
   removing the examined set of bits and either accepting the next N bits from the market block of N-bit symbols when the examined set of bits is a marker or inserting the N-bit known symbol when the examined set of bits is a substitute symbol; and
   repeating the steps of examining and removing on the next set of bits in the market block until the end of the block is reached.

9. A device, comprising:
   circuitry for identifying a plurality of locations within the block of N-bit symbols in which a same N-bit known symbol is located, wherein N is an integer;
   circuitry for representing the known symbol in each of the plurality of locations with a substitute 1-bit symbol having a first value;
   circuitry for marking each remaining symbol in the block of N-bit symbols with a marker bit having a second value; and
   circuitry for transmitting the marked block of marked N-bit symbols and substitute symbols.

10. The device of claim 9, wherein the circuitry for transmitting comprises an output for transferring the compressed block of symbols to another device.

11. The device of claim 10, further comprising a second device, wherein the second device comprises decompression circuitry connected to receive the marked block of N-bit symbols, the decompression circuitry operable to decompress the marked block of N-bit symbols by replacing each substitute symbol with the known N-bit symbol and removing each marker bit to form a decompressed block of N-bit symbols.

12. The device of claim 11, wherein the device and the second device are located within a same integrated circuit.

13. The device of claim 11 being a base station, further comprising an antenna and receiver for receiving the block of N-bit symbols coupled to the processing device.

14. The device of claim 11 being a cellular telephone, further comprising an antenna and receiver for receiving the block of N-bit symbols coupled to the processing device.

15. A method for decompressing a compressed block of N-bit symbols, comprising:

receiving the compressed block of N-bit symbols comprising marked N-bit symbols and substitute symbols, wherein N is an integer; and decompressing the compressed block by replacing each substitute symbol with a known N-bit symbol and removing each marker bit to form a decompressed block of N-bit symbols.

16. The method of claim 15, wherein decompressing comprises:

examining a bit in the compressed block;

removing the examined bit and either accepting the next N bits from the compressed block when the examined bit is a marker bit or inserting the known N-bit symbol when the examined bit is a substitute symbol; and repeating the steps of examining and removing on the next bit in the compressed block until the end of the block is reached.

17. The method of claim 15, wherein the known N-bit symbol is an erasure symbol.

* * * * *